United States Patent Office 3,542,612

Patented Nov. 24, 1970

3,542,612

PHOTOLITHOGRAPHIC MASKS AND METHODS FOR THEIR MANUFACTURE

George R. Cashau, Phillipsburg, N.J., and James W. George, Allentown, Pa., assignors to Western Electric Company, Incorporated, New York, N.Y., a corporation of New York No Drawing. Filed Aug. 11, 1967, Ser. No. 659,896

Int. Cl. C23f *1/02*

U.S. Cl. 156—13 11 Claims

ABSTRACT OF THE DISCLOSURE

Masks for use in photolithographic and etching processes are prepared by the vapor deposition of a metal, such as chromium, onto a transparent plate. The deposition is conducted in two steps that are separated by an intermediate surface abrading operation. The masks so prepared are substantially pinhole-free and are particularly well suited for use in the manufacture of semiconductor devices and integrated circuits where fine resolution is required.

BACKGROUND OF THE INVENTION

Field of the invention

This invention relates generally to improved masks for use in photolithographic and etching processes and to improved methods for their preparation. In addition, this invention relates to improved methods of preparing a substrate with a substantially uniform, pinhole-free coating of a metal. The masks with which this invention is concerned have improved wear-resisting properties and provide fine definition and optical resolution as is required in the manufacture of relatively small, high precision articles. Because the manufacture of semiconductor devices and integrated circuits is particularly demonstrative of the utility of this invention, the masks will be described with particular emphasis on the manufacture of these devices. It is understood, however, that the invention is not to be so limited, but may be used in other photolithographic and etching processes.

Description of the prior art

In the manufacture of semiconductor devices and integrated circuits, it is frequently desirable to utilize photolithographic and etching processes in order to obtain various patterns of materials deposited on or diffused into a substrate. For example, in the preparation of semiconductor devices, the diffusion of a conductivity type determining impurity into a base material may be controlled by means of an oxide mask. In these processes, the base material is provided with an oxide surface layer, a selected portion of which is removed so that the surface may be treated by exposure to various gases having conductivity type determining impurities. Diffusion into the base material will be inhibited by the oxide layer, depending on its thickness and the type of impurity used. Thus, the impurity diffusion takes place only in the unmasked areas, and a base material is produced having a plurality of conductivity type regions differing from the original material. By the use of successive masking and diffusing steps, a diffused structure having complex arrangements of different conductivity type regions is formed.

Typically, the oxide mask patterns are formed by the conventional photolithographic and etching processes. These processes are particularly desirable since they enable complicated patterns to be etched accurately onto the surface of the base material. In these processes, the oxidized surface of the slice is coated with a photosensitive material to form a resist, and the latter is then exposed to ultraviolet light through an apertured mask or stencil. The light-exposed portions of the resist polymerize. Because these polymerized portions are insoluble in developing fluid, they remain as a film on the oxide layer while the protected portions of the resist are dissolved by the fluid leaving a plurality of apertures or windows opened in the resist. As these apertures expose small areas in the oxide layer, a corrosive fluid, such as a dilute aqueous solution of hydrofluoric acid containing ammonium fluoride (e.g., 6.8% HF and 31.6% $NH_4F$ by weight), which will attack the oxide layer but not the slice itself, may be applied to the photoresist and to the exposed areas of the oxide layer to etch a pattern of tiny apertures in the oxide layer. In subsequent manufacturing operations, as noted above, impurity materials may be diffused through these apertures in the oxide mask and into the semiconductor slice to create a pattern of p-n junctions, or metallic contacts may be evaporated on the exposed portions of the semiconductor wafer to form terminals thereon.

The use of these photolithographic and etching processes is also of great utility in the manufacture of integrated circuits. Exemplary of one operation in which these are particularly useful is the development of resistor patterns. Here a layer of low conductivity materials may be evaporated over a substrate and then, in a manner similar to that described above, the substrate is coated with a photoresist material, the photoresist material is exposed to a source of light through a mask constituting a negative image of the desired resistor pattern, the unexposed resist is washed away by means of a solvent, and then the resistor pattern is formed by etching away the exposed surface area of the low conductive material.

It will be understood that the degree of accuracy that can be obtained in photolithographic and etching processes necessarily is limited to the degree of resolution that can be obtained in masking and exposing the photoresist material. Due to the great emphasis being placed upon miniaturization, it is becoming increasingly important to obtain greater and greater resolution. For this reason, a mask that is used in exposing photoresist materials should, ideally, block out ultraviolet light completely in specified areas; it should have a sharp line delineating the transparent and opaque portions of the mask; and, advantageously, the mask should be durable, resistant to physical damage and abrasion, and be readily cleanable.

The most commonly used mask in photoresist operations are photographic emulsion masks. These emulsions, which are comparatively soft, cannot be repeatedly cleaned chemically or by scrubbing without damage to the images. These emulsions do not wear well and repeated use will result in scratching of the opaque areas or an accumulation of particulate material on the surface of the mask which, in either instance, will require replacement of the mask.

Conventional photographic emulsions placed on glass substrates are also disadvantageous in that the height of the emulsion will vary with the opacity of the dark areas. Since intimate contact between the plate and the photoresist material is required in order to obtain good resolution of the fine lines, certain geometrties cannot properly be resolved onto the photoresist material due to this varying thickness of the emulsion.

To avoid the above difficulties and to provide a more durable, long wearing mask, it has been proposed that masks be produced by coating glass plates with thin films of metal. For example, thin films of such materials as Inconel and chromium may be laid down on glass substrates by using conventional vapor deposition processes. After the glass plate has been coated, the desired image is formed on the plate by etching away selected portions of the thin metallic film. Conveniently, these processes make use of photolithographic and etching processes in which a photoresist material, preferably a "positive" photoresist, is laid down over the coated glass substrate and exposed to ultraviolet light through a master photographic image. When a positive photoresist is used, the exposed photoresist material is then washed away and the desired patterns are etched, as by means of acid, on the surface of the glass plate.

While an excellent mask can be prepared by evaporating chromium onto a glass plate, it has proved difficult to obtain good adhesion over the entire surface of the plate between the chromium and the glass, and, as a result, small bits of chromium may be dislodged from isolated areas of the surface. This will cause windows or pinholes to be opened in the opaque metal coating and, if the pinholes are too numerous, the utility of the mask will be destroyed.

SUMMARY OF THE INVENTION

Accordingly, it is an object of this invention to provide an improved mask for use in photolithographic processes having both good resolution and sufficient durability so that it may be reused a number of times.

Another object of this invention is to provide an improved mask for use in photolithographic processes that is substantially free of pinholes in the opaque areas.

Yet another object of this invention is to provide improved methods for manufacturing photolithographic masks that have good resolution, that are long wearing, and that are substantially free from pinholes.

Briefly, these and other objects of this invention are achieved by depositing chromium on a glass plate in two vapor deposition steps. After the initial layer of chromium has been deposited, the coating is abraded, as with a blast of high pressure air, in order to remove any loosely adhering bits of chromium. A second layer of chromium is then deposited over the plate, and, surprisingly, it has been found that the adhesion between the chromium and the glass is good over the entire plate, so that a uniform coating substantially free from pinholes is obtained.

While the theoretical basis of this invention is not fully understood, it is theorized that certain interfering materials that adversely affect adhesion are present on the surface of a glass plate and are not removed by cleaning and degreasing. It is believed that these interferants have greater affinity or adhesion for chromium than for glass so that they will be removed along with the chromium during the abrading operation. Subsequently, when the second layer of chromium is vapor deposited onto the surface of the plate, the chromium will adhere to the glass at the exposed areas since the interfering materials have now been removed.

Example

A glass plate was prepared by cutting it from a soda-lime glass sold as ordinary commercial sheet glass. The glass plate was carefully cleaned and degreased by boiling in a commercially available caustic inorganic detergent. The plate was then boiled in hydrogen peroxide, rinsed with deionized water, and blown off with clean air. All remaining moisture was removed by drying the plate in an oven at about 120° C. for about 30 minutes.

The cleaned glass plate was then mounted in a vacuum deposition apparatus and a layer of chromium about 400–600 Angstrom units thick was deposited. In the apparatus used in this example, the cathode was comprised of a filament electroplated with a layer of chromium so that chromium would vaporize when the filament was energized. The desired thickness of chromium deposition was obtained by energizing the filament for about 13 seconds.

After application of the first chromium layer, the plate was abraded with air to remove any loose, poorly adhering bits of chromium. This abrasion was achieved by moving a directed stream of 60 p.s.i. air back and forth over the surface of the plate.

The plate was then returned to the vacuum deposition apparatus and the filament again was energized for about 13 seconds. This resulted in a substantially uniform final coating of about 1,000 Angstrom units that was essentially free from pinholes.

The chromium plated glass plate was then covered with a standard positive photoresist material, and a mask pattern transferred from a master photographic emulsion to the photoresist by contact printing under ultraviolet light. The pattern was then developed by washing away with a solvent the exposed photoresist to bare the metal film.

The exposed areas of the metal film were then removed by immersing the plate in an etching solution. The etching solution may be any acid capable of dissolving the chromium, such as hydrochloric or sulfuric acid. In this example, and in the preferred practice of this invention, the etching solution is comprised of a mixture of sulfuric acid and phosphoric acid as described more fully in our copending patent application, Ser. No. 659,-895, filed of even date.

When the etching had progressed to the desired extent, the reaction was abruptly stopped by immersing the plate in a solution of ammonium hydroxide. Such a stop bath prevents undercutting of the edges of the photoresist image by acid attacking laterally from the etched areas.

The protective photoresist material was then removed from the plate and the chromium mask thus revealed was cleaned in a dilute solution of sodium hydroxide by vigorous scrubbing with a soft vinyl sponge. After a final rinse with deionized water, the mask was blown completely dry using compressed air.

A number of masks were prepared using the procedures of the above example, all having 5 or less pinholes per square inch, which, in practice, is within acceptable limits. Also, it was found that these masks can produce images as small as 0.0002 inch square. At present, the only limitation in definition lies in defining images on the photoresist material on the chromium coated glass plate.

In use, these chromium masks are comparatively wear resistant and last much longer than emulsion masks. While the life of a mask will vary a great deal depending upon the quality of the substrates that contact the masks, it has been found that, on the average, the usable life of masks prepared in accordance with this invention range from 5 to 50 times that of comparable emulsion masks.

As discussed in the example, a stop bath may be utilized to prevent undercutting of the edges of the photoresist image. It can be understood that to the extent undercutting takes place, it will not be possible to obtain a sharp line delineating the transparent areas from the opaque areas of the mask. Since undercutting may take place more readily with thicker coatings of chromium, it is important to limit the chromium layer to be as thin as possible while still thick enough to be opaque to the transmission of ultraviolet light. Generally, this preferred thickness will lie in a range between about 800 and 1,200 Angstrom units.

Although certain embodiments of the invention have been described in the specification, it is to be understood that the invention is not limited thereto, is capable of modification, and can be rearranged without departing from the spirit and scope of the invention.

What is claimed is:

1. The method of preparing a substrate with a substantially uniform, pinhole-free coating of a metal comprising the steps of:

depositing a first layer of metal over the substrate;

abrading the first layer of metal to remove any loosely adhered metal particles; and depositing a second layer of metal over the abraded first layer of metal.

2. The method of claim 1, in which the layers of metal are deposited by vapor deposition.

3. The method of claim 1, wherein the abrading step is performed by subjecting the first layer of metal to a blast of air.

4. The method of claim 1, further comprising the preliminary step of cleaning and degreasing the substrate prior to the first metal-depositions step.

5. The method of claim 1, in which the metal is chromium and the substrate is glass.

6. The method of claim 5, in which the thickness of the first layer of chromium is between about 400 and 600 Angstrom units.

7. The method of claim 6, in which the total thickness of the chromium coating is between about 800 and 1,200 Angstrom units.

8. The method of preparing a reusable chromium-on-glass mask for use in photolithographic processes, with a substantially uniform, pinhole-free coating of chromium on a glass substrate, which comprises the steps of:
- cleaning and degreasing the substrate;
- vapor depositing a first layer of chromium over the substrate having a thickness between about 400 and 600 Angstrom units;
- subjecting the first layer of chromium to a blast of compressed air;
- vapor depositing a second layer of chromium over the air-blasted first layer to a total thickness at least double that of the first layer; and then
- selectively etching the composite chromium coating so deposited to form a mask.

9. A substantially uniform, pinhole-free chromium-on-glass photolithographic mask prepared in accordance with the method of claim 8.

10. The chromium-on-glass mask of claim 9, wherein the total thickness of the chromium coating is between about 800 and 1,200 Angstrom units, and having no more than 5 pinholes per square inch.

11. The method of preparing a glass substrate with a substantially uniform, pinhole-free coating of a metal comprising the steps of:
- vapor depositing a first layer of chromium over the glass substrate;
- air blasting the first layer of chromium to remove any loosely adhered chromium particles; and
- vapor depositing a second layer of chromium over the air blasted first layer of chromium.

References Cited

UNITED STATES PATENTS

| | | | |
|---|---|---|---|
| 1,862,231 | 6/1932 | McFarland | 156—13 X |
| 2,484,540 | 10/1949 | Whitehouse | 204—36 |
| 2,883,306 | 4/1959 | Cotter | 117—205 |

OTHER REFERENCES

RCA Technical Notes, RCATN. No. 574, March 1964, Sheets 1 and 2.

JACOB H. STEINBERG, Primary Examiner

U.S. Cl. X.R.

156—15; 117—64, 71, 107, 207; 204—36